US005134015A

United States Patent [19]

Ohtake et al.

[11] Patent Number: 5,134,015

[45] Date of Patent: Jul. 28, 1992

[54] APERTURE PATTERN-PRINTING PLATE FOR SHADOW MASK AND METHOD FOR MANUFACTURING THE SAME

[75] Inventors: Yasuhisa Ohtake; Yasushi Magaki, both of Fukaya, Japan

[73] Assignee: Kabushiki Kaisha Toshiba, Kawasaki, Japan

[21] Appl. No.: 596,013

[22] Filed: Oct. 11, 1990

[30] Foreign Application Priority Data

Oct. 13, 1989 [JP] Japan ........ 1-267716
Oct. 13, 1989 [JP] Japan ........ 1-267717
Oct. 13, 1989 [JP] Japan ........ 1-267718

[51] Int. Cl.$^5$ ........ G03F 9/00; B05D 5/12

[52] U.S. Cl. ........ 428/195; 427/96; 428/336; 428/447; 428/901; 430/5; 430/311

[58] Field of Search ........ 430/5, 311; 428/76, 428/195, 209, 901, 446, 447, 336; 427/96

[56] References Cited

U.S. PATENT DOCUMENTS

| | | | |
|---|---|---|---|
| 3,897,251 | 7/1975 | Detrich et al. | 430/396 |
| 4,176,605 | 12/1979 | Yoshida et al. | 406/29 |
| 4,588,676 | 5/1986 | Moscony et al. | 430/5 |
| 4,656,107 | 4/1987 | Moscony et al. | 430/23 |
| 4,669,871 | 6/1987 | Wetzel et al. | 430/23 |
| 4,735,890 | 4/1988 | Nakane | 430/311 |

FOREIGN PATENT DOCUMENTS

| | | |
|---|---|---|
| 0385480 | 9/1990 | European Pat. Off. . |
| 52-31660 | 3/1977 | Japan . |
| 60-87327 | 5/1985 | Japan . |
| 61-69067 | 4/1986 | Japan . |
| 62-85251 | 4/1987 | Japan . |

*Primary Examiner*—Bruce H. Hess
*Assistant Examiner*—B. A. Krynski
*Attorney, Agent, or Firm*—Cushman, Darby & Cushman

[57] ABSTRACT

An aperture pattern-printing plate used for manufacturing a shadow mask, which comprises a transparent substrate, and an emulsion layer which is formed on the transparent substrate and which is opaque at portions corresponding to apertures of the shadow mask and transparent at other portions, wherein the emulsion layer is overlaid with at least one of the following a substantially-amorphous, transparent scratch-preventing film obtained by hydrolysis and condensation of metal alcoholate and having a thickness of not more than 1.5 μm, and a foreign matter-preventing film formed substantially of silicone and having a thickness of not more than 0.5 μm. The foreign matter-preventing film is formed on the scratch-preventing film if the foreign matter-preventing film and scratch-preventing film are both formed.

24 Claims, 2 Drawing Sheets

APERTURE PATTERN-PRINTING PLATE FOR SHADOW MASK AND METHOD FOR MANUFACTURING THE SAME

BACKGROUND OF THE INVENTION

1. Field of the Invention

This invention concerns an aperture pattern-printing plate used for making a shadow mask, and a method of manufacturing the same.

2. Description of the Related Art

Shadow masks commonly used for color cathode ray tubes have a large number of apertures. These shadow masks are used to allow three electron beams corresponding to red, green, and blue emitted from the electron gun to impinge on each corresponding phosphor through the apertures. They are usually manufactured by a photo-etching process, for example as described below.

First, a shadow mask substrate consisting of a continuous strip of metal sheet is degreased and washed, and a photoresist layer of a given thickness is formed on both the principal surfaces of the mask.

Second, a pair of printing plates, each corresponding to the aperture pattern of a shadow mask, are laid over the respective principal surfaces of the shadow mask substrate in tight contact therewith. The printing plates are opaque at portions corresponding to the apertures of the shadow mask, and are transparent at the other portions. The two printing plates are similar to each other in the arrangement of the opaque portions, but the opaque portions of one printing plate is larger than the opaque portions of the other printing plate in an ordinary case. The photoresist layers are exposed to the ultraviolet light passing through the respective printin plates. The unexposed parts of the photoresist layers corresponding to the apertures of the shadow mask are dissolved and are removed by a warm water spray. The mask substrate is dried and baked so as to leave a residual photoresist layer resistant to etching at points other than the apertures. An etchant is sprayed over the surfaces of the mask substrate to perforate the apertures. Then, the resultant structure is washed, and the photoresist layer is removed therefrom. After the removal of the photoresist layer, the structure is washed again and dried, to obtain a shadow mask.

FIG. 1 is a sectional view of an example of a printing plate used in the exposure step mentioned above. As is shown in FIG. 1, a flat glass substrate 1 is overlaid with an underlying layer 2. On this underlying layer 2, a flat emulsion layer 3 is formed by coating the layer 2 with a suspension containing silver halide dispersed in gelatin. The emulsion layer 3 is made up of opaque portions 4 and transparent portions 5. The opaque portions 4 correspond in location to the respective apertures of a shadow mask, so that the opaque portions 4 and the transparent portions 5 jointly constitute a shadow mask pattern. The underlying layer 2 is formed for the purpose of improving the coating and adhering properties of the emulsion layer 3.

The shadow mask pattern, which is constituted by the opaque and transparent portions 4 and 5 of the emulsion layer 3, is formed as follows. First, an original pattern plate is prepared by use of a pattern generator which is generally referred to as a photo plotter. An unexposed photosensitive glass plate is stacked upon, and brough into tight contact with the original pattern plate. A master pattern, whose pattern is reverse to that of the original pattern plate, is prepared by exposing the photosensitive glass plate to the light passing through the original pattern plate. It should be noted that the master pattern may have a pattern defect, such as a pattern defect originating from the unexposed photosensitive glass plate or a pattern defect arising from foreign matter entering the region between the original pattern plate and the photosensitive glass. If such a pattern defect is found in the master pattern, it is corrected or removed manually. In a darkroom, thereafter, the master pattern is stacked upon, and brought into vacuum contact with a photosensitive plate having an unexposed emulsion layer 3. By use of a 200-watt mercury lamp, the photosensitive plate is exposed to the light passing through the master pattern. The photosensitive plate, thus exposed, is then subjected to ordinary development processing, including developing, first washing, fixing, second washing, drying, etc. As a result, a pattern printing plate having a pattern equivalent to the original pattern, is obtained.

The pattern printing plate obtained in the abovementioned manner is attached to an exposure device, which can hold the pattern printing plate vertically. As such an exposure device, the exposure device disclosed in e.g. Published Examined Japanese Patent Application (PEJPA) No. 56-13298 is employed. The emulsion layer of the pattern printing plate attached to the exposure device is brought into vacuum contact with the photoresist film formed on a shadow mask substrate, and the photoresist film on the shadow mask substrate is exposed to the light emitted from the exposure device.

In the process of successively manufacturing shadow masks, a continuous strip of shadow mask material coated with a photoresist film is fed, brought into tight contact with a pattern printing plate, exposed to light, and wound up. In the manufacturing process wherein those operations are repeatedly performed, it may happen that the support frame used for supporting a pattern printing plate will have a mechanically-assembling error (including a clearance). It may also happen that the support frame and the pattern printing plate will ununiformly expand, due to the heat generated by the exposure device. In such cases, the pattern printing plate and the shadow mask material are inevitably shifted from each other though slightly, so that the emulsion layer of the pattern printing plate and the photosensitive film of the shadow mask substrate are abraded against each other. Even if the above operations are performed in a dust-free room, dust particles or other undesirable particles are inevitably produced in the meantime. For example, the metallic burrs left on the shadow mask material, the residual pieces of resist, the paint pieces and metallic powder dropping off the exposure device, and the dust particles flying up as the operator walks on the floor constitute the undesirable particles mentioned above. It is inevitable that such undesirable particles will stick to the photoresist film or the emulsion layer. It is also inevitable that such particles will enter the region between the photoresist film and the emulsion layer when these two are brought into tight contact with each other. It should be also noted that the photoresist film of the shadow mask substrate is baked appropriately at 200° C. and has a pencil hardness of about 5H to 6H, whereas the emulsion layer of the pattern printing plate is not baked and has a low pencil hardness of about B to 1H. Therefore, if the emulsion layer of the pattern printing plate is abraded against the photoresist film or has dust particles sticking thereto, it is very likely that the emulsion layer will be damaged, resulting in a pattern defect. If such a pattern defect is generated, all shadow masks produced thereafter will have defective apertures.

To shove this problem, it is thought to cover the emulsion film with a surface film formed of acrylic resin or amino alkyd resin. However, in order to provide the surface film with a hardness equivalent to or higher than that of the photoresist film, the thickness of the surface film has to be at least 10 $\mu$m.

FIG. 2 is a cross sectional view illustrating the state where a shadow mask material and a pattern printing plate provided with a surface film have been brought into tight contact with each other, for light exposure. As is shown in FIG. 2, the pattern printing plate is made up of: a glass substrate 1; an underlying layer 2 formed on the glass substrate 1; an emulsion layer 3 which is formed on the underlying layer 2 and which has opaque and transparent portions 4 and 5 jointly constituting a shadow mask pattern; and a surface film 9 made of e.g acrylic resin and formed on the emulsion layer 3. The shadow mask material is made up of a shadow mask substrate 8, and a photoresist film 7 formed on the shadow mask substrate 8. The shadow mask material is stacked on the pattern printing plate, with its photoresist film 7 in tight contact with the surface film 9 of the pattern printing plate. The photoresist film 7 has a pattern 10 formed by exposing the film 7 to the light passing through the shadow mask substrate 8. Normally, the emulsion layer 3 has a thickness of about 6 $\mu$m, and the photosensitive film 7 has a thickness in the range of approximately 5 to 10 $\mu$m. Since the surface film 9 is sandwiched between the photosensitive film 7 and the emulsion layer 7, as is depicted in FIG. 2, the photoresist film 7 and the emulsion layer 3 are located away from each other by the distance corresponding to the thickness of the surface film 9. If the photosensitive film 7 and the emulsion layer 3 are away from each other more than a certain distance, a latent pattern image to be printed o the photosensitive film 7 in the exposure step is adversely affected by light diffusion. In particular, the dimensions of the latent pattern image 10 may change in accordance with a variation in the distribution of the light emitted from the light source or a variation in the exposure time. In light of this point, the surface film 9 should be as thin as possible.

In recent years, larger-sized color cathode ray tubes have come into general use. In accordance with this trend, pattern printing plates and their pattern areas have been increased. This being so, it has become difficult to uniformly form the surface film 9 having a given thickness. In other words, it is likely that the surface film 9 will have uneven thickness. If the surface film 9 has such uneven thickness, a shadow mask will have apertures of different dimensions, thus degrading the quality of a color cathode ray tube.

Even if the surface film 9 is hard enough to resist scratches, this is still insufficient. That is, the surface film 9 has to be prevented from being electrically charged and from being viscous. If the surface film 9 is electrically charged or viscous, foreign matter is liable to stick to the surface film 9. If the foreign matter sticking to the surface film 9 is so large as to adversely affect the dimensions of the apertures of the shadow mask, a defective pattern is produced in the exposure step. In addition, if the foreign matter sticking to the surface film 9 has a size exceeding the total thickness of the emulsion layer, photosensitive film and surface film combined, the pattern will be inevitably scratched. To solve this problem, it may be thought to form a charge-preventing film on the emulsion layer, so as to prevent foreign matter from electrostatically sticking to the emulsion layer. In general, however, such a charge-preventing film is not very hard, and its scratch resistance is lower than that of the photosensitive film of the shadow mask material. With such a charge-preventing layer, therefore, it is difficult to effectively prevent scratches from being left on the pattern.

Additionally, if the surface film 9 of the pattern printing plate is viscous or low in hardness, air cannot be easily removed from the interface between the pattern printing plate and the shadow mask material when these two are brought into vacuum contact with each other. Therefore, this vacuum contact step requires much time and cannot be performed at high efficiency.

As mentioned above, the conventional pattern printing plate is not strong against scratches, and produces a defective pattern if it is abraded or has foreign matter. If the pattern printing plate becomes defective during the process of successively manufacturing shadow masks, such a defective pattern printing plate has to be replaced with another, with the manufacturing operation being stopped. If such replacement is required a number of times, it is difficult to manufacture shadow masks at good yield.

SUMMARY OF THE INVENTION

Accordingly, an object of the present invention is to provide a pattern printing plate which withstands scratches well, hardly permits foreign matter to stick thereto, and enables a vacuum contact operation to be performed in a short time.

Another object of the present invention is to provide a method of manufacturing such a pattern printing plate.

To achieve the above objects, the present invention provides an aperture pattern-printing plate used for manufacturing a shadow mask, which comprises:

a transparent substrate; and an emulsion layer which is formed on the transparent substrate and which is opaque at portions corresponding to apertures of the shadow mask and transparent at other portions, wherein the emulsion layer is overlaid with at least one of the following:

a substantially-amorphous, transparent scratch-preventing film obtained by hydrolysis and condensation of metal alcoholate and having a thickness of not more than 1.5 $\mu$m; and a foreign matter-preventing film formed substantially of silicone and having a thickness of not more than 0.5 $\mu$m, the foreign matter-preventing film being formed on the scratch-preventing film if the foreign matter-preventing film and scratch-preventing film are both formed.

The present invention also provides a method of manufacturing an aperture pattern-printing plate used for making a shadow mask, which comprises the steps of:

preparing a transparent substrate which has an emulsion layer formed on one principal surface thereof;

forming a shadow mask pattern in the emulsion layer such that those portions corresponding to apertures of the shadow mask are opaque and other portions are transparent; and wherein the step of forming the shadow mask pattern is followed by the step of forming a scratch-preventing film and/or the step of forming a foreign matter-preventing film, the step of forming the scratch-preventing film including the substeps of: coating an alcoholic solution of metal alcoholate over the emulsion layer in which the shadow mask pattern is formed, drying the coated alcoholic solution to obtain a transparent amorphous film; and heat-curing the amorphous film, the step of forming the foreign matter-preventing film including the substeps of: coating silicone oil obtained by modifying a dimethyl silicone polymer; drying the coated silicone oil to obtain a silicone film; and curing the silicone film, the step of forming the scratch-preventing film being performed prior to the step of forming the foreign matter-preventing film, if these two steps are both executed, so that the scratch-preventing film is overlaid with the foreign matter-preventing film.

The aperture pattern-printing plate of the present invention withstands scratches well and hardly permits foreign matter to stick thereto. Therefore, it hardly causes a pattern defect. Moreover, since foreign matter hardly sticks to the aperture pattern-printing plate, air can be easily discharged from the interface between the pattern-printing plate and the shadow mask material when these two are brought into vacuum contact with each other. Therefore, the operation for this vacuum contact can be easily performed in a short time.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BROEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will now be described in detail, with reference to the accompanying drawings.

Figure 3:
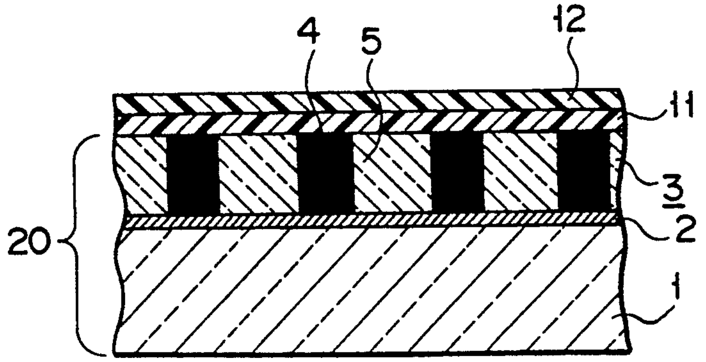
FIG. 3 is a sectional view of a pattern printing plate according to the present invention, which is provided with both a scratch-preventing film and a foreign matter-preventing film.
Figure 4:
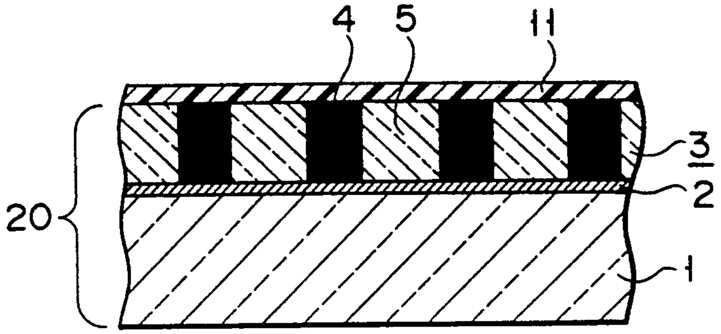
FIG. 4 is a sectional view of another pattern printing plate according to the present invention, which is provided with a scratch-preventing film.
Figure 5:
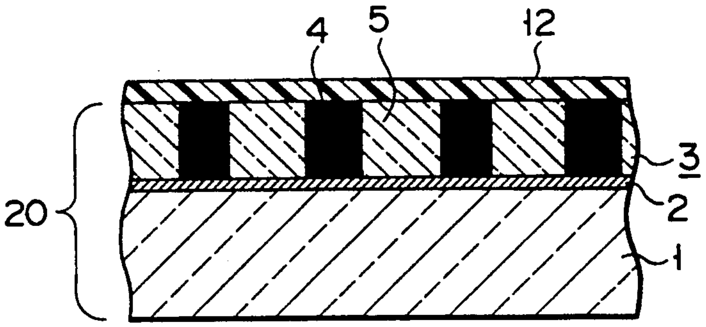
FIG. 5 is a sectional view of still another pattern printing plate according to the present invention, which is provided with a foreign matter-preventing film.

FIGS. 3–5 are sectional views each showing an example of a pattern printing plate according to the present invention.

Referring first to FIG. 3, the pattern printing plate of the invention is made up of: a transparent substrate 1 (e.g., a glass plate); an underlying layer 2 formed of gelatin; an emulsion layer 3 formed by coating the layer 2 with a suspension of gelatin in which silver halide is dispersed; a transparent, amorphous scratch-preventing film 11 obtained by the hydrolysis and condensation of metal alcoholate; and a foreign matter-preventing film 12 formed of silicone. These layers and films are formed on the substrate 1 in the order mentioned.

The underlying layer 2 is not absolutely necessary, but its formation is desirable since it improves the fixing property of the emulsion layer 3 to be formed thereon. As the material of the underlying layer 2, gelatin or gelatin solution, containing hydrophilic resin or the like can be used. The thickness of the underlying layer 2 is preferably within the range of about 1 to 2 μm.

A shadow mask pattern is formed in the emulsion layer 3. The shadow mask pattern is constituted by opaque portions 4 corresponding to the apertures of a shadow mask, and transparent portions 5 corresponding to the other portions of the shadow mask. As the emulsion of the emulsion layer 3, a suspension of gelatin, in which silver halide such as silver bromide, silver chloride, silver iodide, or the like is dispersed, can be used. A mixture of these silver halide may be used. The thickness of the emulsion layer 3 is preferably within the range of 4 to 8 μm, more preferably within the range of 5 to 7 μm.

The scratch-preventing film 11 is very thin; it is not more than 1.5 μm in thickness. The thickness of the scratch-preventing film 11 is preferably within the range of 0.3 to 1.5 μm, and more preferably within the range of 0.5 to 1.0 μm. The thickness of the scratch-preventing film 11 is dependent upon the concentration of the coating liquid to be used and the number of times by which the coating liquid is applied If the thickness of the scratch-preventing film 11 is less than 0.3 μm, it is likely that pin holes will be formed. Conversely, if the thickness is more than 1.5 μm, it is likely that emulsion layer 3 is cracked. The metal of the metal alcoholate used for forming the scratch-preventing film 11 is selected from the group including iron, titanium, zirconium, and silicon. Further, the metal alcoholate is preferably selected from the group including methylate, ethylate, and butylate. The metal alcoholate is preferably coated on the emulsion layer a number of times, such that the layer formed by one-time coating is within the thickness of 0.3 to 0.5 μm. If the thickness of the layer formed by one-time coating is more than 0.5 μm, the layer may crack or its thickness may not become uniform. In addition, the resultant scratch-preventing film may not be transparent, adversely affecting the light transmission. Conversely, if the thickness of the layer formed by one-time coating is less than 0.3 μm, it is likely that pin holes will be produced. The hardness of the scratch-preventing film 11 should be equal to, or higher than that of the photosensitive film of the shadow mask material. The scratch-preventing film 11 should preferably be as hard as possible; normally, its pencil hardness is within the range of about 6H to 9H. The hardness of the scratch-preventing film 11 is dependent on the composition of the solution to be coated and on the baking conditions.

The foreign matter-preventing film 12 is very thin; it is not more than 0.5 μm in thickness. The thickness of the foreign matter-preventing film 12 is preferably within the range of 0.05 to 0.5 μm. If the thickness of the foreign matter-preventing film 12 is more than 0.5 μm, the film 12 tends to lose transparency. The foreign matter-preventing film 12 is a silicone film and is formed by coating the emulsion layer with a silicone oil. This silicone oil is obtained by partially bonding the Si atoms of either a dimethyl disiloxane or a dimethyl trisiloxane to an alkyl group or allyl group. The contact angle of the foreign matter-preventing film 12 with reference to water is preferably wider than 100° or more. As long as the contact angle is wider than this angle, the critical surface tension is low and is within the range of about 20 to 32 dyne/cm. As a result, the foreign matter-preventing film 12 prevents any substance, such as foreign matter, from sticking to the surface thereof. The silicone film serves as a lubricator and has a low coefficient of friction.

It should be noted that the pattern printing plate of the present invention does not necessarily require both the scratch-preventing film 11 and the foreign matter-preventing film 12 mentioned above. The formation of only one of the films 11 and 12 is sufficient to the pattern printing plate of the invention.

FIG. 4 is a sectional view showing a pattern printing plate provided only with a scratch-preventing film 11. As is shown in FIG. 4, the pattern printing plate is made up of: a glass substrate 1; an underlying layer 2; an emulsion layer 3 in which a shadow mask pattern is formed; a protective film 6; and a scratch-preventing film 11. The layers and films are formed on the substrate in the order mentioned.

The pattern printing plate provided with the scratch-preventing film 1 has the advantages described below. Since the scratch-preventing film 11 has a hardness equal to or larger than that of the photosensitive film formed on the shadow mask substrate, it is hard to scratch even if foreign matter sticks to the surface. In addition, since the amorphous material constituting the scratch-preventing film 11 has satisfactory water-and chemical-resisting properties, the pattern printing plate does not have degraded quality even after it is cleaned with water or detergent. Thus, the pattern printing plate is prevented from having a pattern defect. Since, therefore, the shadow masks produced by use of the pattern printing plate do not have defective apertures, their manufacturing yield can be improved.

FIG. 5 is a sectional view showing a pattern printing plate provided only with a foreign matter-preventing film 12. As is shown in FIG. 5, the pattern printing plate is made up of: a glass substrate 1; an underlying layer 2; an emulsion layer 3 in which a shadow mask pattern is formed; and a foreign matter-preventing film 12. The layers and films are formed on the substrate 1 in the order mentioned.

The pattern printing plate provided with the foreign matter-preventing film 12 has the advantages described below. The foreign matter-preventing film 12 has a wide contact angle with reference to water and therefore has poor wettability. In addition, it has a low coefficient of friction and has a very small adhesive strength. Thus, it does not adhere to the photosensitive film formed on the shadow mask material. Further, foreign matter, such as dust, does not easily stick to it. Since, therefore, the foreign matter-preventing film 12 protects the emulsion layer 3 from scratches when the pattern printing plate is brought into tight contact with the shadow mask material, the pattern printing plate is prevented from having a pattern defect. Additionally, air can be easily discharged from the interface between the pattern printing plate and the shadow mask material in the process of manufacturing shadow masks. Therefore, the pattern printing plate and the shadow mask material can be brought into tight contact with each other in a short time. As a result, the mass productivity of shadow masks can be improved, and the pattern-printing plate withstands long use.

In the case where the scratch-preventing film and the foreign matter-preventing film are both provided, as shown in FIG. 3, the pattern printing plate has the advantages arising from both of them.

According to the present invention, the pattern printing plate mentioned above is manufactured as follows.

Referring to FIG. 3, the glass substrate 1 is coated with an aqueous solution of gelatin. The coated solution is cooled to a temperature below 30° C., to thereby form an underlying layer 2 on the glass substrate 1. The underlying layer 2 is coated with a suspension of gelatin being dispersed silver halide, and the coated suspension is dried, to thereby form an emulsion layer 3 on the underlying layer 2. In this manner, a photosensitive plate 20 is manufactured. Then, a master pattern having a reversed shadow mask pattern, is brought into vacuum contact with the emulsion layer 3. In this state, the emulsion layer 3 is exposed to the light passing through the master pattern, to form a latent pattern image. With this latent pattern image being developed, the emulsion layer 3 is made to have opaque portions 4 corresponding to the apertures of a shadow mask, and transparent portions 5 corresponding to the other portions of the shadow mask.

Thereafter, a metal alcoholate containing iron, titanium, zirconium, silicon or the like is diluted with an alcohol, such as an isopropyl alcohol or an n-butyl alcohol, to thereby obtain an alcoholic solution of metal alcoholate. The alcoholic solution, thus obtained, is coated on the surface of the photosensitive plate 20 by use of a dip coating method. More specifically, the surface of the protective film 6 formed on the glass substrate 1 is dipped in the alcoholic solution. Then, the glass substrate 1 is slowly pulled up from the alcoholic solution and is dired at room temperature, so as to form a transparent amorphous vetrious film on the photosensitive plate 20. After being dried, the glass substrate 1 is based at a temperature within the range of 60° to 180° C. Due to the hydrolysis and condensation produced by the baking treatment, the amorphous vetrious film is hardened. As a result, a scratch-preventing film 11 is formed on the photosensitive plate 20. The thickness of the scratch-preventing film 11 is preferably not more than 1.5 μm. A more desirable range of the thickness of the scratch-preventing film 11 is from 0.3 to 1.5 μm, and the most desirable range of that thickness is from 0.5 to 1.0 μm. The thickness of a scratch-preventing film 11 coated by one coating step is dependent on the concentration of the alcohol solution to be used. The thickness of the film 11 coated by one coating step is preferably from 0.3 to 0.5 μm. In order to allow the scratch-preventing film 11 to have a desirable thickness, the coating step mentioned above is repeated a number of times. The hardness of the scratch-preventing film 11 is preferably equal to or larger than that of the photosensitive film of the shadow mask material. The hardness of the scratch-preventing film 11 is dependent on the composition and concentration of the alcoholic solution, and is preferably within the range of 6H to 9H or so in terms of pencil hardness. The method for coating the alcoholic solution of metal alcoholate is not limited to the dip coating method mentioned above. A known coating method, such as a spin coating method or a spray coating method, may be used, if so desired.

The scratch-preventing film 11 mentioned above is overlaid with a foreign matter-preventing film 12. This foreign matter-preventing film 12 is formed a follows. First, a silicone oil containing a dimethyl silicone polymer and having a viscosity in the range of about 200 to 800 cps is prepared. The dimethyl silicone polymer is of a semi-inorganic and semi-organic structure wherein part of the Si atoms are bonded to alkyl groups or allyl groups. The dimethyl silicone polymer is a siloxane derivative having siloxane bonds, and is exemplified by a dimethyl siloxane or a dimethyl trisiloxane derived from dimethyl dichlorosilane. Then, the silicone oil is diluted with a Freon (trademark) or a trichlene, such that the concentration of the dimethyl silicone polymer in the resultant solution accounts for not more than 1% (preferably within the range of 0.1 to 0.5%). This solution is coated on the surface of the scratch-preventing film 12 by use of a dip coating method. The photosensitive plate, thus processed, is slowly pulled up from the solution and is dried at room temperature, so as to form a silicone film on the scratch-preventing film 11. After being dried, the silicone film is baked for 15–60 minutes at a temperature within the range of 50° to 150° C. Due to this baking step, the silicone film is hardened, with the result that the foreign matter-preventing film 12 is formed on the surface of the scratch-preventing film 11. The thickness of the foreign matter-preventing film 12 is dependent upon the concentration of the silicone oil to be used and the number of times by which the silicone oil is applied. The thickness of the foreign matter-preventing film 12 is preferably not more than 1.5 μm. A more desirable range of the thickness of the foreign matter-preventing film 12 is from 0.3 to 1.5 μm, and the most desirable range of that thickness is from 0.5 to 1.0 μm. The method for coating the silicone oil is not limited to the dip coating method mentioned above. A. known coating method, such as a spin coating method or a spray coating method, may be used, if so desired. It should be also noted that the silicone film need not be hardened by the baking treatment. For example, the silicone film may be left as it is in an environment of room temperature for a long time (e.g., for one day).

In the above, the step of forming the foreign matter-preventing film 12 was described as being performed after the step of forming the scratch-preventing film 11. However, the method according to the present invention need not necessarily involve both those steps. The requisite for the method is to include one of the two steps though both of them may be involved. Further, the scratch-preventing film 11 and the foreign matter-preventing film 12 may be formed on both sides of the pattern printing plate, though FIGS. 3–5 illustrate them as being formed on one side only.

EXAMPLE 1

A glass substrate was coated with a 5% aqueous solution containing gelatin at 35° C., and the coated solution was cooled it to a temperature of about 25° C., so as to form an underlying layer. Then, this underlying layer was coated with an emulsion of a 8% aqueous solution of geratin in which silver bromide and silver iodide were dispersed in amounts equivalent to the solid content of geratin, and the coated emulsion was coded to a temperature of 25° C., to obtain an emulsion layer. As a result of these treatments, a photosensitive plate was obtained. A predetermined master pattern was brought into vacuum contact with the photosensitive plate, and the photosensitive plate was exposed to the light passing through the master pattern such that a predetermined pattern was formed in the emulsion layer of the photosensitive plate.

Next, tetraethylsilicate was diluted with a isopropyl alcohol, and the alcoholic solution, thus obtained, was coated on the photosensitive plate by use of a dip coating method. The coated alcoholic solution was dried and then baked at about 150° C., to thereby obtain a scratch-preventing film. The thickness of this scratch-preventing film was 1 μm, and the pencil hardness thereof was about 8H.

Thereafter, a silicone oil was diluted with trichlorotrifluoroethane until it had a concentration of 0.2%. The diluted solution of the silicon oil was coated on the scratch-preventing film by a dip coating method. After being dried, the coated silicone oil was baked at 150° C. for 15 minutes, to thereby obtain a foreign matter-preventing film. The thickness of the foreign matter-preventing film was 0.1 μm, and the pencil hardness thereof was about 2H.

Figure 1:
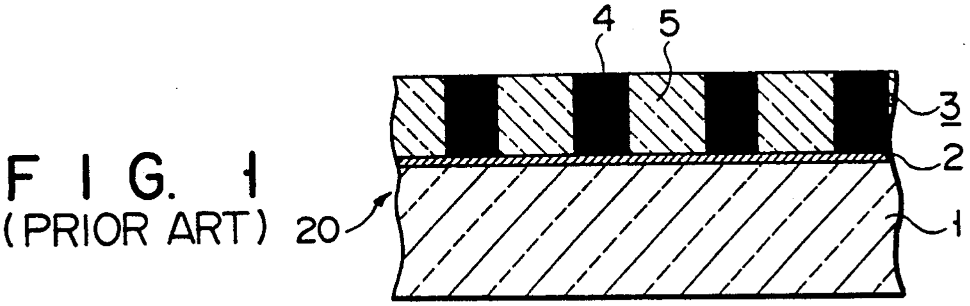
FIG. 1 (PRIOR ART)
FIG. 1 is a sectional view of a conventional pattern printing plate used for manufacturing a shadow mask.
Figure 2:
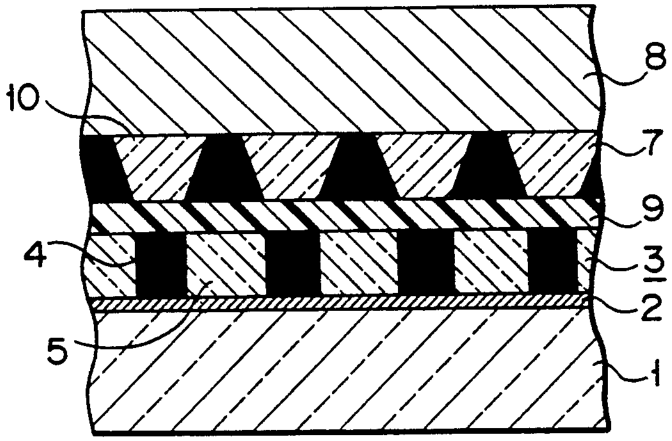
FIG. 2 (PRIOR ART)
FIG. 2 is a sectional view showing a state where the conventional pattern printing plate and a shadow mask material are in vacuum contact with each other.

The above pattern printing plate, which was provided with both the scratch-preventing film and the foreign matter-preventing film, was mounted on a shadow mask-manufacturing apparatus. For the sake of comparison, a conventional pattern printing plate, such as that shown in FIG. 1, was also mounted on the apparatus. From each of these pattern printing plates, shadow masks were manufactured. The average number of shadow mask materials to which the pattern could be printed by use of one pattern printing plate and the number of pattern defects generated in one shadow mask, were measured. The results of this measurement are shown in Table 1 below.

EXAMPLES 2 AND 3

A pattern printing plate provided only with a scratch-preventing film was prepared as Example 2, by following similar procedures to those in Example 1. Measurement similar to that of Example 1 was also made with respect to the pattern printing plate of Example 2. The results of the measurement are shown in Table 1.

A pattern printing plate provided only with a foreign matter-preventing film was prepared as Example 3, by following similar procedures to those in Example 1. Measurement similar to that of Example 1 was also made with respect to the pattern printing plate of Example 3. The results of the measurement are shown in Table 1.

As is shown in Table 1, in the case where the pattern printing plates according to the present invention were used, the number of shadow mask materials to which the pattern could be printed by use of one pattern printing plate could be remarkably increased. Since, therefore, the pattern printing plates of the present invention could be used for a long time, the number of times by which the pattern printing plate wa replaced with another could be considerably reduced. As a result, both the manufacturing yield of shadow masks and the rate of operation of the exposure device could be improved. Further, the numbers of scratches and missing pattern portions caused in one shadow mask were very small. Since each shadow mask had few pattern defects, the time required for the manual correction of the patterns could be shortened, accordingly. Still further, each of the pattern printing plates according to the invention does not adhere to the photosensitive film of the shadow mask material when it is brought into vacuum contact therewith, so that air can be easily discharged from the interface between the shadow mask material and the pattern printing plate. In the prior art, the time needed for the vacuum contact between a pattern printing plate and a shadow mask material was in the range of 50 to 80 seconds, though the time may vary depending upon the characteristics of the pattern printing plate and the area of the pattern. In the case where a pattern printing plate of the present invention was used, the time needed for the vacuum contact could be shortened by 20 seconds on an average. Accordingly, the number of shadow mask materials printed per unit time could be increased, resulting in improvement of productivity.

According to the present invention, moreover, the room where the exposure step was carried out did not require a very high degree of cleanliness. Even if the cleanliness of that room was changed from 1,000 class (prior art) to 10,000 class, the number of pattern defects did not increase. Accordingly, the room need not be cleaned a large number of times, as in the prior art. Therefore, when a pattern printing plate of the invention was used, the cost needed for the maintenance of the shadow mask-manufacturing apparatus (e.g., the maintenance of an air conditioner of the apparatus) could be reduced, in comparison with the prior art.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

TABLE

| Pattern Printing Plate | Pencil Hardness | Average Number of Shadow Masks Produced from One Pattern | Number of Defects Generated in One Pattern Printing Plate: Scratch | Number of Defects Generated in One Pattern Printing Plate: Missing Pattern Portion |
|---|---|---|---|---|
| Conventional one | 1H | 720 | 4 | 3 |
| Example 1 | 8H | 7,300 | 0 | 1 |
| Example 2 | 8H | 6,200 | 1 | 1 |
| Example 3 | 2H | 1,680 | 2 | 3 |

What is claimed is:

1. An aperture pattern-printing plate used for manufacturing a shadow mask, comprising:
a transparent substrate;
an emulsion layer which is formed on the transparent substrate and which is opaque at portions corresponding to apertures of the shadow mask and is transparent at other portions; and
a foreign matter sticking preventing film, of a thickness in the range of 0.05 to 0.5 μm, which is formed on the emulsion layer, is substantially constituted by a silicone film obtained by coating a silicone oil diluted with an organic solvent.

2. An aperture pattern-printing plate according to claim 1, wherein said silicone film is formed by coating the emulsion layer with a silicone oil, said silicone oil containing a dimethyl siloxane or a dimethyl trisiloxane in which part of Si atoms are bonded to an alkyl group or allyl group.

3. An aperture pattern-printing plate according to claim 1, further comprising a protective film interposed between said emulsion layer and said foreign matter-preventing film, said protective film being substantially formed of gelatin and a hardener.

4. An aperture pattern-printing plate used for manufacturing a shadow mask, comprising:
a transparent substrate;
an emulsion layer which is formed on the transparent substrate and which is opaque at portions corresponding to apertures of the shadow mask and is transparent at other portions; and
scratch-preventing film which is formed on the emulsion layer, is substantially formed of a transparent amorphous material obtiend by hydrolysis and condensation of a metal alcoholate, and has a thickness of 0.3 μm to 1.5 μm.

5. An aperture pattern-printing plate according to claim 4, wherein said metal alcoholate includes one kind of metallic element selected from the group including iron, titanium, zirconium, and silicon.

6. An aperture pattern-preventing plate according to claim 4, wherein said metal alcoholate is one kind of alcoholate selected from the group including methylate, ehtylate, and butylate.

7. An aperture pattern-printing plate according to claim 4, wherein said scratch-preventing film is formed by repeatedly coating the emulsion layer with an amorphous material layer a number of times, such that the amorphous material layer formed by one-time coating is in the range of 0.3 to 0.5 μm.

8. An aperture pattern-printing plate used for manufacturing a shadow mask, comprising:
a transparent substrate;
an emulsion layer which is formed on the transparent substrate and which is opaque at portions corresponding to apertures of the shadow mask and is transparent at other portions; and
a scratch-preventing film which is formed on the emulsion layer, which is substantially formed of a transparent amorphous material obtained by hydrolysis and condensation of a metal alcoholate, and has a thickness of 0.3 μm to 1.5 μm; and
a foreign matter sticking preventing film which is formed on the scratch-preventing layer, which is substantially constituted by a silicone film and has a thickness sufficient to prevent foreign matter sticking and not more than 0.5 μm.

9. An aperture pattern-printing plate according to claim 8, wherein said foreign matter-preventing film has a thickness in the range of 0.05 to 0.5 μm.

10. An aperture pattern-printing plate according to claim 8, wherein said silicone film is formed by coating the emulsion layer with a silicone oil, said silicone oil containing a dimethyl siloxane or a dimethyl trisiloxane in which part of Si atoms are bonded to an alkyl group and/or allyl group.

11. An aperture pattern-printing plate according to claim 8, wherein said metal alcoholate includes one kind of metallic element selected from the group including iron, titanium, zirconium, and silicon.

12. An aperture pattern-preventing plate according to claim 8, wherein said metal alcoholate is one kind of alcoholate selected from the group including methylate, ethylate, and butylate.

13. An aperture pattern-printing plate according to claim 8, wherein said scratch-preventing film has a thickness in the range of 0.5 to 1.0 μm.

14. An aperture pattern-printing plate according to claim 8, wherein said scratch-preventing film is formed by coating the emulsion layer with an amorphous material layer a number of times, such that the amorphous material layer formed by one-time coating is in the range of 0.3 to 0.5 μm.

15. A method of manufacturing an aperture pattern-printing plate used for making a shadow mask, comprising the steps of:

preparing a transparent substrate which has an emulsion layer formed on one principal surface thereof;

forming a shadow mask pattern in the emulsion layer such that those portions corresponding to apertures of the shadow mask are opaque and other portions are transparent;

coating an alcoholic solution of a metal alcoholate over the emulsion layer in which the shadow mask pattern is formed;

forming a transparent amorphous glassy film by drying the alcoholic solution coated over the emulsion layer; and forming a scratch-preventing film by heat-curing the glassy film.

16. A method according to claim 15, wherein said metal alcoholate includes one kind of metallic element selected from the group including iron, titanium, zirconium, and silicon.

17. A method according to claim 15, wherein said metal alcoholate is one kind of alcoholate selected from the group including methylate, ethylate, and butylate.

18. A method according to claim 15, wherein said scratch-preventing film is formed by coating the emulsion layer with an amorphous material layer a number of times, such that the amorphous material layer formed by one-time coating is in the range of 0.3 to 0.5 μm.

19. A method according to claim 15, wherein said amorphous film is heat-cured at a temperature in the range of 60° to 180° C.

20. A method of manufacturing an aperture pattern-printing plate used for making a shadow mask, comprising the steps of:

preparing a transparent substrate which has an emulsion layer formed on one principal surface thereof;

forming a shadow mask pattern in the emulsion layer such that those portions corresponding to apertures of the shadow mask are opaque and other portions are transparent;

coating the emulsion layer, in which the shadow mask pattern is formed, with a silicone oil obtained by modifying a dimethyl silicone polymer;

forming a silicone film by drying the silicone oil coated on the emulsion layer; and forming a foreign matter-preventing film by curing the silicone film.

21. A method according to claim 20, wherein said silicone oil contains a dimethyl siloxane or a dimethyl trisiloxane in which part of Si atoms are bonded to alkyl groups and another part bonded to allyl groups.

22. A method according to claim 20, further comprising the step of:

forming a protective film between the emulsion layer and the foreign matter-preventing film, said protective film being substantially formed of gelatin and a hardener.

23. A method according to claim 20, wherein said silicone film is cured by baking the same at a temperature in the range of 50° to 150° C.

24. A method of manufacturing an aperture pattern-printing plate used for making a shadow mask, comprising the steps of:

preparing a transparent substrate which has an emulsion layer formed on one principal surface thereof;

forming a shadow mask pattern in the emulsion layer such that those portions corresponding to apertures of the shadow mask are opaque and other portions are transparent;

coating the emulsion layer, in which the shadow mask pattern is formed, with an alcoholic solution of a metal alcoholate;

forming a transparent amorphous glassy film by drying the alcoholic solution coated on the emulsion layer;

forming a scratch-preventing film by heat-curing the glassy film;

coating the scratch-preventing film with a silicone oil obtained by modifying a dimethyl silicone polymer;

forming a silicone film by drying the silicone oil coated on the scratch-preventing film; and forming a foreign matter-preventing film by curing the silicone film.

* * * * *